United States Patent
Huang et al.

(10) Patent No.: US 10,910,260 B2
(45) Date of Patent: *Feb. 2, 2021

(54) METHOD FOR MANUFACTURING SEMICONDUCTOR DEVICE

(71) Applicant: TAIWAN SEMICONDUCTOR MANUFACTURING CO., LTD., Hsinchu (TW)

(72) Inventors: Wei-Chieh Huang, Zhudong Township (TW); Chin-Wei Liang, Zhubei (TW); Feng-Jia Shiu, Jhudong Township (TW); Hsia-Wei Chen, Taipei (TW); Jieh-Jang Chen, Zhubei (TW); Ching-Sen Kuo, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/664,455

(22) Filed: Oct. 25, 2019

(65) Prior Publication Data
US 2020/0058545 A1    Feb. 20, 2020

Related U.S. Application Data

(63) Continuation of application No. 15/904,888, filed on Feb. 26, 2018, now Pat. No. 10,510,587.
(Continued)

(51) Int. Cl.
*H01L 21/768* (2006.01)
*H01L 27/24* (2006.01)
(Continued)

(52) U.S. Cl.
CPC .. *H01L 21/76819* (2013.01); *H01L 21/31053* (2013.01); *H01L 21/31056* (2013.01);
(Continued)

(58) Field of Classification Search
CPC . H01L 21/768; H01L 21/78619; H01L 43/02; H01L 43/08; H01L 43/10;
(Continued)

(56) References Cited

U.S. PATENT DOCUMENTS 10,510,587 B2 * 12/2019 Huang ............... H01L 22/12
2008/0305627 A1 12/2008 Maekawa
(Continued)

OTHER PUBLICATIONS

Non-Final Office Action issued in U.S. Appl. No. 15/904,888, dated Nov. 1, 2018.
(Continued)

*Primary Examiner* — Chuong A Luu
(74) *Attorney, Agent, or Firm* — McDermott Will & Emery LLP

(57) ABSTRACT

A method for manufacturing a semiconductor device includes forming a structure protruding from a substrate, forming a dielectric layer covering the structure, forming a dummy layer covering the dielectric layer, and performing a planarization process to completely remove the dummy layer. A material of the dummy layer has a slower removal rate to the planarization process than a material of the dielectric layer.

20 Claims, 9 Drawing Sheets

Related U.S. Application Data

(60) Provisional application No. 62/565,391, filed on Sep. 29, 2017.

(51) Int. Cl.
*H01L 27/22* (2006.01)
*H01L 45/00* (2006.01)
*H01L 21/3105* (2006.01)
*H01L 21/66* (2006.01)
*H01L 43/12* (2006.01)

(52) U.S. Cl.
CPC .............. *H01L 22/12* (2013.01); *H01L 22/26* (2013.01); *H01L 27/228* (2013.01); *H01L 27/2436* (2013.01); *H01L 27/2463* (2013.01); *H01L 43/12* (2013.01); *H01L 45/1233* (2013.01); *H01L 45/146* (2013.01); *H01L 45/1675* (2013.01); *H01L 21/76802* (2013.01)

(58) Field of Classification Search
CPC ....... H01L 43/12; H01L 29/82; H01L 27/226; H01L 27/228; G11C 11/14; G11C 11/161; G11C 11/1697; G11C 11/5607; G11C 14/0036; G11C 14/0045; G11C 14/0081; G11C 19/02; G11C 19/10; G11C 19/14; G11C 2211/5615; G11C 2211/55616
USPC ............................................................ 438/3
See application file for complete search history.

(56) References Cited

U.S. PATENT DOCUMENTS

2012/0164808 A1 6/2012 Yin et al.
2014/0199838 A1 7/2014 Na et al.

OTHER PUBLICATIONS

Final Office Action issued in U.S. Appl. No. 15/904,888, dated May 15, 2019.
Notice of Allowance issued in U.S. Appl. No. 15/904,888, dated Aug. 15, 2019.

* cited by examiner

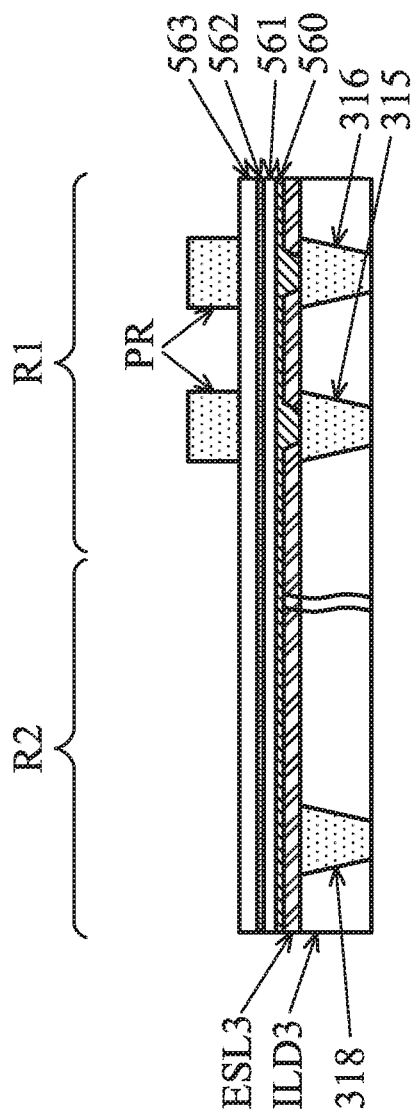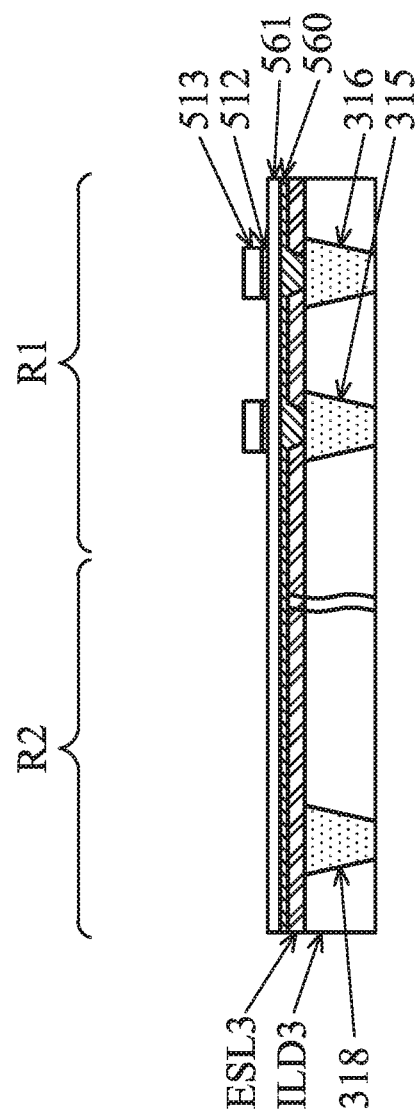

METHOD FOR MANUFACTURING SEMICONDUCTOR DEVICE

CROSS-REFERENCE TO RELATED APPLICATION

This application is a Continuation Application of U.S. application Ser. No. 15/904,888, filed Feb. 26, 2018, now U.S. Pat. No. 10,510,587, which claims priority to U.S. Provisional Application No. 62/565,391 filed Sep. 29, 2017, the entire disclosures of each of which are incorporated herein by reference.

BACKGROUND

A thin film deposited on structures protruding from a substrate can have non-flatness topography. As such, a planarization process is performed to the thin film to obtain a planarized surface of the thin film for later manufacturing processes. Contemporarily, a photolithography process has been used to provide a patterned layer over a region on which the structures are not formed so as to act as a control layer to planarize the thin film. Such a process, however, is complicated and expensive.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 shows a process step to manufacture a semiconductor device by a method according to embodiments of the present disclosure.

FIG. 11 shows a process step to manufacture a semiconductor device by a method according to embodiments of the present disclosure.

DETAILED DESCRIPTION

Figure 1:
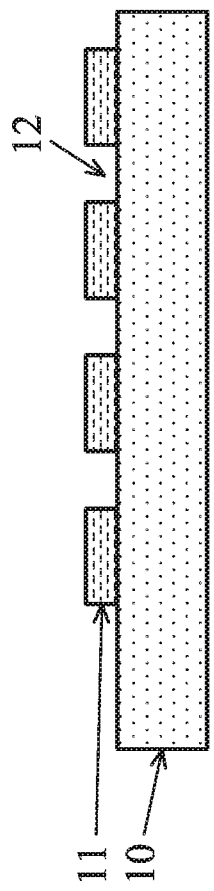
FIG. 1 shows a process step to manufacture a semiconductor device by a method according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the present disclosure, "about" or "approximately" used to describe a value of a parameter means that the parameter is equal to the described value or that the parameter is within a certain range of the described value, when design error/margin, manufacturing error/margin, measurement error etc. are considered. Such a description should be recognizable to one of ordinary skill in the art.

FIGS. 1-4 show process steps to manufacture a semiconductor device by a method according to embodiments of the present disclosure.

As shown in FIG. 1, patterns 11 of a semiconductor device are formed over a substrate 10. In some embodiments, the patterns 11 include, but not limited to, a semiconductor material layer (such as a Si layer, a Ge layer, and/or a SiGe layer) based on which the semiconductor device such as transistors can be formed, or a conductive material (such as metal layer or a doped polysilicon layer) based on which electrical connections among various layers of the semiconductor device can be formed. In other embodiments, each of the patterns 11 can be an integrated structure including, for example, a memory cell such as an embedded magnetoresistive random access memory (eMRAM) cell or an embedded resistive random access memory (eRRAM) cell. In some embodiments, the patterns 11 protrude from the substrate 10 and are spaced-apart from each other by spaces or openings 12 therebetween.

The substrate 10 can be a semiconductor substrate formed of, for example, one of Si, Ge, SiGe, SiC, SP, SiPC, InP, InAs, GaAs, AlInAs, InGaP, InGaAs, GaAsSb, GaPN, AlPN, and any other suitable material, or an insulating substrate such as a glass substrate.

Although not shown in FIG. 1, one or more layers including semiconductor layers made of silicon, germanium, or any other suitable semiconductor materials, dielectric layers made of spin-on-glass (SOG), silicon oxide, silicon nitride, SiON, SiOCN, or conductive layers made of Cu, W, Al, AlCu, TiN, TiW, Ti, Co, Ni, TaN, Ta, TiN, TaN, TaAlC, TiC, TaC, Co, Al, TiAl, HfTi, TiSi, TaSi, NiSi, PtSi, or TiAlC, can be formed prior to the patterns 11. In this case, the one or more layers (not shown) are disposed between the patterns 11 and the substrate 10.

Figure 2:
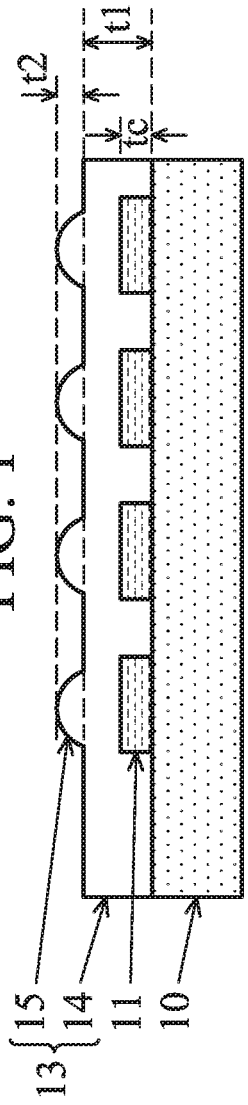
FIG. 2 shows a process step to manufacture a semiconductor device by a method according to embodiments of the present disclosure.

Referring to FIG. 2, a dielectric layer 13, which can act as an interlayer dielectric layer, is formed to cover the patterns 11 and the remaining surface of the substrate 10 not covered by the patterns 11. The dielectric layer 13 includes one or more layers of insulating materials such as silicon oxide, silicon nitride, SiON, SiOCN, formed, for example, by low pressure chemical vapor deposition (LPCVD), plasma enhanced chemical vapor deposition (PECVD), flowable chemical vapor deposition (flowable CVD), or any other suitable processes. In some embodiments, the dielectric layer is spin-on-glass (SOG) or fluoride-doped silicate glass (FSG). In some embodiments, the dielectric layer 13 is made of an extreme low-k (ELK) dielectric having a dielectric constant less than about 2.5 or a low-k dielectric having a dielectric greater than that of the ELK but less than thermal silicon oxide. In some embodiments, the dielectric layer 13 is a porous layer. In some embodiments, the ELK includes one or more of fluorine-doped silicon dioxide (FSG), carbon-doped silicon dioxide (SOC), porous silicon dioxide, or porous (SiOC). The materials to form the dielectric layer 13 are not limited to these examples, and can be any other suitable materials.

Figure 4:
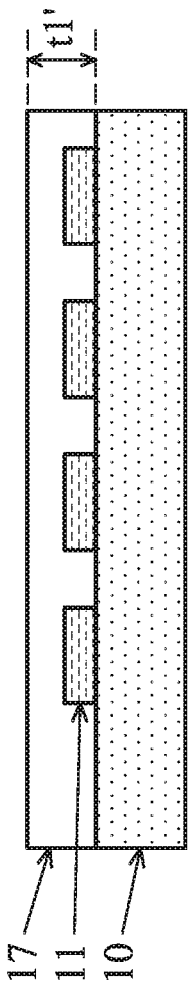
FIG. 4 shows a process step to manufacture a semiconductor device by a method according to embodiments of the present disclosure.

As shown in FIG. 1, the patterns 11 protruding from the substrate 10 are spaced-apart from each other by the openings 12. In this case, the dielectric layer 13 formed by PECVD, LPCVD, CVD, flowable CVD, or spin coating to cover the patterns 11 has a topography corresponding to the patterns 11, as shown in FIG. 2. For example, the dielectric layer 13 includes protrusions 15 above the patterns 11. In some embodiments, a thickness t2 of the protrusions 15 of the dielectric layer 13 can be the same as or less than a thickness tc of the patterns 11. Portions 14 of the dielectric layer 13, i.e., the remaining portions of the dielectric layer 13 other than the protrusions 15, have a thickness t1 greater than the thickness tc of the patterns 11. As such, after a planarization process such as a chemical-mechanical polishing (CMP) to be described later with reference to FIG. 4 is performed to the dielectric layer 13, the patterns 11 remain to be embedded in the remaining dielectric layer 13 and are not impacted or damaged by the planarization process.

Although not shown, the portions of the dielectric layer 13 between adjacent protrusions 15 of the dielectric layer 13 can have concave structures recessed toward the substrate 10, when the material to form the dielectric layer 13 fills the openings 12 between the patterns 11 at the time when the same material is simultaneously formed on the patterns 11 with a substantially the same deposition rate. In a case in which the portions of the dielectric layer 13 between adjacent protrusions 15 of the dielectric layer 13 have concave structures, the thickness t1, defined to be the shortest distance from the lowest portion of the exterior surface of the concave structures to the substrate 10, is greater than the thickness tc of the patterns 11. As such, regardless of the topography of the dielectric layer 13, the remaining dielectric layer 13 after the planarization process such as the chemical-mechanical polishing (CMP) to be described later with reference to FIG. 4 can have a planarized surface over the patterns 11.

Figure 3:
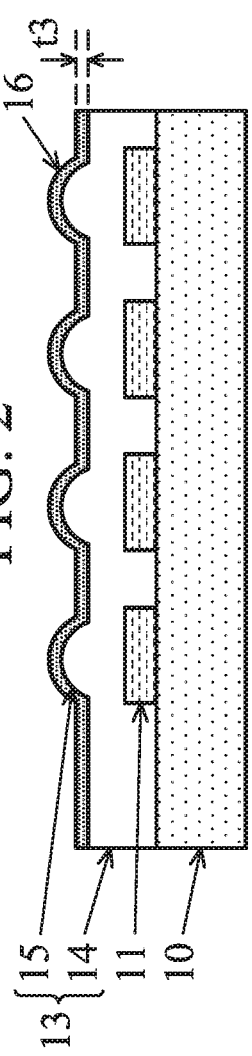
FIG. 3 shows a process step to manufacture a semiconductor device by a method according to embodiments of the present disclosure.

Then, referring to FIG. 3, a dummy layer 16 is formed over the dielectric layer 13. In some embodiments, the dummy layer 16 covers the entire upper surface of the dielectric layer 13, although the present disclosure is not limited thereto.

The dummy layer 16 can be one of TiN, TaN, USG (undoped silicate glass), SiON, or tetra-ethyl-organo-silicate (TEOS) having a different selectivity in terms of removal rate, friction, spectrum, reflectance, etc., as compared to the dielectric layer 13, so as to allow an endpoint detection tool to in-situ monitor the planarization process such as the CMP. In some embodiments, the dummy layer 16 can be formed by CVD, PECVD, LPCVD, physical vapor deposition (PVD), or any other suitable process.

One of the ordinary skill in the art should understand that the material forming the dummy layer 16 is different from the material forming the dielectric layer 13. In some embodiments, the dummy layer 16 can be a dielectric layer but made of another material different from the material used to form the dielectric layer 13. In some embodiments, the dummy layer 16 can be the same material to form the dielectric layer 13 but is made by a method different from that is used to form the dielectric layer 13, so that the dummy layer 16 and the dielectric layer 13 can have different properties in terms of removal rate, friction, spectrum, reflectance, etc., as compared to the dielectric layer 13, so as to allow the endpoint detection tool to in-situ monitor the planarization process such as the CMP.

As briefed above, in some embodiments, the dummy layer 13 can be used as an endpoint detection layer to monitor the planarization process (to be described later with reference to FIG. 4) performed by a planarization tool. Due to the difference in the materials for forming the dielectric layer 13 and the dummy layer 16, an in-situ sensing and endpoint detection tool, integrated to the planarization tool and based on sensing a change in spectrum of the reflected light or a change in friction, can be used to precisely detect whether the dummy layer 16 is completely removed but without unintentionally over polishing the dielectric layer 13.

In some embodiments, a ratio of a rate to remove the dielectric layer 13 to a rate to remove the dummy layer 16 by slurry used in the planarization process, under the same process condition, is greater than 1 and equal to or less than 3. In some embodiments, the ratio of the rate to remove the dielectric layer 13 to the rate to remove the dummy layer 16 by the same planarization process can be 1.1 to 2.9 or can be 1.5 to 2.5; the present disclosure, however, is not limited thereto. In some embodiments, the material for the dummy layer 16 can be determined based on slurry used in the planarization process and the material of the dielectric layer 13. Once the slurry and the material of the dielectric layer 13 are determined, candidate materials for forming the dummy layer 16 can be determined. In some embodiments, the candidate materials for forming the dummy layer 16 can be further narrowed in consideration of relative selectivities (or ratios) in terms of friction, spectrum, reflectance, etc. detectable by the in-situ sensing and endpoint detection tool, with respect to the material for making the dielectric layer 13. In some embodiments, the dummy layer 16 is one of the candidate materials that exhibits a relatively higher selectivity in terms of friction, spectrum, reflectance, etc. detectable by the in-situ sensing and endpoint detection tool, with respect to the material for making the dielectric layer 13. In some embodiments, a material of the dummy layer 16 has a slower removal rate to the planarization process such as CMP as compared to a material of the dielectric layer 13. In some embodiments, the dielectric layer 13 is made of ELK, for example, a dielectric material layer having a dielectric constant (k) lower than thermal silicon oxide, and in this case, the dummy layer 16 can be TiN, TaN, USG oxide, SiON, or TEOS which has an excellent selectivity over ELK.

In some embodiments, a thickness t3 of the dummy layer 16 can be from about 30 nm to about 100 nm.

In a case in which the thickness t3 of the dummy layer 16 is less than about 30 nm, the dummy layer 16 may not be able to completely cover the dielectric layer 13 which has non-flat topography caused by the patterns 11, and thus, the in-situ sensing and endpoint detection tool may not be able to accurately detect the transition in planarizing from a mixture of the dummy layer 16 and the dielectric layer 13 to the entire dielectric layer 13, thereby lowering reliability of accurate control of the planarization process.

On the other hand, in a case in which the thickness t3 of the dummy layer 16 is more than about 100 nm, a processing time to form the dummy layer 16 is relatively long and thus, product turnaround time is relatively long, thereby increasing manufacturing cost.

The present disclosure, however, is not limited thereto. In other embodiments, the thickness t3 of the dummy layer 16 can be about 10 nm to about 300 nm, dependent on design particulars.

In some embodiments, the thickness t3 of the dummy layer 16 can be equal to greater than the thickness tc of the patterns 11. In other embodiments, the thickness t3 of the dummy layer 16 can be less than the thickness tc of the patterns 11. In one embodiment, t3=tc+t0 can be satisfied, in which t0 is a predetermined thickness, for example, from about 15 nm to about 25 nm, in accordance with a selected slurry used in the CMP.

After forming the dummy layer 16, a planarization process such as a CMP process is performed to the dummy layer 16 by the CMP tool until the dummy layer 16 is completely removed. The in-situ sensing and endpoint detection tool integrated to the CMP tool can be used to detect and determine whether the dummy layer 16 is completely removed. In the transition of the CMP process performed to a mixture of the dummy layer 16 and the dielectric layer 13 to the material only including the material of the dielectric layer 13, the in-situ sensing and endpoint detection tool detects a change in reflected light such as spectrum or friction in accordance with a predetermined criterion. The in-situ sensing and endpoint detection tool determines that a change satisfying the predetermined criterion indicates that the dummy layer 16 is completely removed. Accordingly, the in-situ sensing and endpoint detection tool sends a control signal to the CMP tool to request to stop the CMP process.

FIG. 4 shows a cross-sectional view of the structure after the CMP process.

In some embodiments, the CMP tool stops the CMP process upon receipt of the control signal to stop. The present disclosure, however, is not limited thereto.

In other embodiments, the CMP process can continue for a predetermined period, for example, 10 seconds to 20 seconds, or continue for a predetermined number of CMP cycles, for example, 10 to 20 CMP cycles, once the in-situ sensing and endpoint detection tool senses such a change and sends such a control signal to the CMP tool to stop the CMP process. In this case, the extra CMP time/cycles can ensure complete removal of the dummy layer 16 but without directly impacting the patterns 11 embedded in the remaining portion of the dielectric layer 13. In some embodiments, the remaining dielectric layer 13 after the CMP process is reduced to a thickness t1' and becomes an interlayer dielectric layer 17 having a planarized upper surface suitable for additional processes. In some embodiments, 15 nm≤t1−t1'≤25 nm is satisfied, in a case in which the extra CMP process is performed to ensure the completely removal of the dummy layer 16. The present disclosure, however, is not limited to. In other embodiments, no extra CMP process is performed at the time when the dummy layer 16 is just completely removed, and in this case, the thickness t1' of the interlayer dielectric layer 17 is the same as the thickness t1.

The additional processes, although not shown, can include a process to form openings in the interlayer dielectric layer 17 to expose the patterns 11, a process to deposit a conductive material such as a metal to fill the openings and to cover the planarized upper surface of the interlayer dielectric layer 17, and a process to planarize the conducive material so as to cover the conductive material to contacts (vias) or wirings formed in the openings of the interlayer dielectric layer 17, thereby electrically connecting the patterns 11 to an upper layer subsequently formed over the interlayer dielectric layer 17 and the contacts or the wrings.

In some embodiments, the CMP process is directly performed to the dummy layer 16, without using a compensation layer such as a patterned photoresist. In this case, a photolithography process is not performed after forming the dummy layer 16 or after forming the dielectric layer 13 and prior to performing the CMP process. As such, a manufacturing cost and manufacturing complexity can be reduced as compared to a comparative example, in which a photolithography process is used before a CMP process in order to make compensation patterns to monitor the CMP process.

The above-described method can be used to manufacture various semiconductor devices which include a dielectric layer over structures protruding from a substrate. For example, FIG. 5 to be described below shows a semiconductor device and FIGS. 6-19 to be described below show process steps for manufactured the semiconductor device shown in FIG. 5, at least based on the principle described above with reference to FIGS. 1-4.

Figure 5:
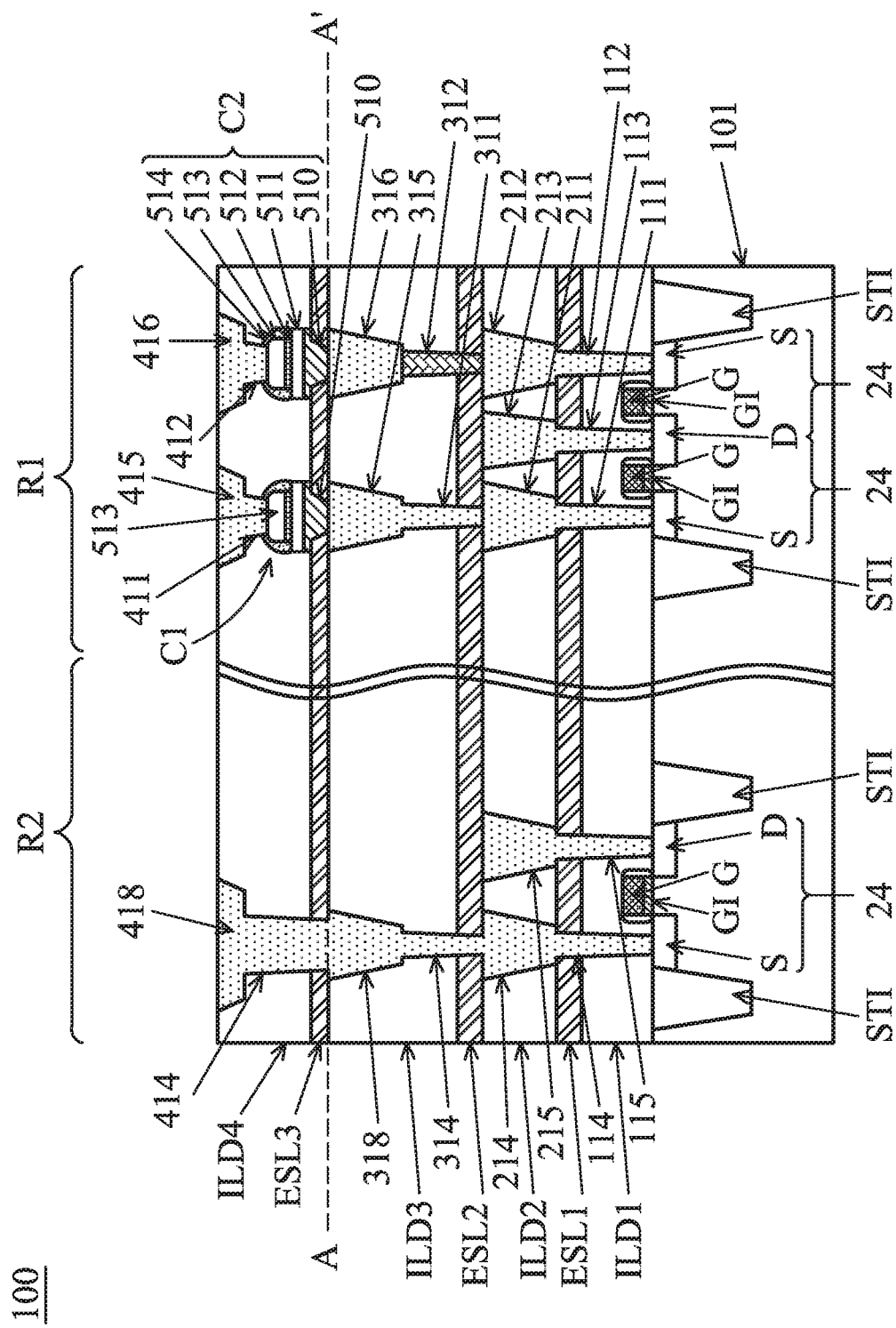
FIG. 5 shows a schematically cross-sectional view of a memory device, an interlayer dielectric layer of which is manufactured by a method according to embodiments of the present disclosure.

FIG. 5 shows a schematically cross-sectional view of a memory device, an interlayer dielectric layer of which is manufactured by a method according to embodiments of the present disclosure.

As shown in FIG. 5, a memory device 100 includes a plurality of memory cells arranged in a matrix shape formed in a memory region R1 on a substrate 101, and a logic circuit comprised of one or more transistors 24 in a peripheral region R2 on the substrate 101 adjacent to the memory region R1. For convenience, two memory cells C1 and C2 will be described below as an example of the plurality of memory cells.

Each of the memory cells C1 and C2 includes a bottom electrode 510 made of, for example, TiN and/or TaN or a combination thereof, and an additional bottom electrode 511 made of, for example, Ti and/or Ta or a combination thereof. Each of the memory cells C1 and C2 further includes a memory film 512 including, for example, transition-metal-oxide such as $HfO_2$, $Al_2O_3$, $ZrO_2$, $TaO_2$ or $Ta_2O_5$ in a case in which the memory cell is an RRAM cell or including magnetic tunnel junction (MTJ) film in a case in which the memory cell is an MRAM cell. Each of the memory cells C1 and C2 also includes a top electrode 513 made of, for example, TiN and/or TaN. The present disclosure, however, is not limited thereto. The bottom electrode 510, the additional bottom electrode 511, and the top electrode 513 can be made of any other suitable film.

The bottom electrode 510 of the memory cell C1 is electrically coupled to a source region S of a transistor 25 below the memory cell C1, through interconnections including a contact (or a via) 111 penetrating through a first etch-stop layer ESL1 and a first interlayer dielectric layer ILD1, a wiring layer 211 penetrating through a second interlayer dielectric layer ILD2 formed over the first etch-stop layer ESL1, a contact (or a via) 311 penetrating through a second etch-stop layer ESL2 over the second interlayer dielectric layer ILD2, and a contact (or a via) 315 together with the contact 311 formed in a third interlayer dielectric layer ILD3 over the second etch-stop layer ESL2.

In some embodiments, each of the first and second etch-stop layers ESL1 and ESL2 can be SiC, silicon nitride, or silicon oxide having a thickness from about 20 nm to about 50 nm.

In some embodiments, each of the first, second, and third interlayer dielectric layers ILD1, ILD2, and ILD3 is made of SOG, silicon oxide, silicon nitride, SiON, SiOCN. In some embodiments, each of the first, second, and third interlayer dielectric layers ILD1, ILD2, and ILD3 is an ELK dielectric layer. In some embodiments, each of the first, second, and third interlayer dielectric layers ILD1, ILD2, and ILD3 is a porous layer, and each of the first and second etch-stop layers ESL1 and ESL2 is a non-porous layer or a porous layer having a porous degrees less than that of each of the first, second, and third interlayer dielectric layers ILD1, ILD2, and ILD3.

As shown in FIG. 5, the top electrode 513 of the memory cell C1 is electrically connected to a wiring 415 through a contact 411 formed in a fourth interlayer dielectric layer ILD4.

The bottom electrode 510 of the memory cell C2 is electrically coupled to a source region S of a transistor 26 below the memory cell C2, through interconnections. The interconnections include a contact (or a via) 112 penetrating through the first etch-stop layer ESL1 and the first interlayer dielectric layer ILD1, a wiring layer 212 penetrating through the second interlayer dielectric layer ILD2 formed over the first etch-stop layer ESL1, a contact (or a via) 312 penetrating through the second etch-stop layer ESL2 over the second interlayer dielectric layer ILD2, and a contact (or a via) 316 together with the contact 312 formed in the third interlayer dielectric layer ILD3 over the second etch-stop layer ESL2. The top electrode 513 of the memory cell C2 is electrically connected to a wiring 416 through a contact 412 formed in the fourth interlayer dielectric layer ILD4.

Still referring to FIG. 5, each of the memory cells C1 and C2 includes a spacer layer 514 made of, for example, silicon nitride or SiC, to cover side surfaces of the memory film 512 so as to prevent the side surfaces of the memory film 512 from being exposed. Each spacer layer 514 has an opening to expose the respective top electrodes 513, such that the contacts 411 and 412 filling the openings of the space layers 514 are electrically connected to the top electrodes 513 of the memory cells C1 and C2, respectively.

In some embodiments, drain regions D of the transistors 25 and 26 are made of the same heavily doped semiconductor region and are electrically connected to a wiring 213 formed in the second interlayer dielectric layer ILD2 through a contact (or a via) 113 penetrating through the first etch-stop layer ESL1 and the first interlayer dielectric layer ILD1.

The memory device 100 further includes a wiring 418 in the peripheral region R2 electrically coupled to a source region S of the transistor 24 in the peripheral region R2, through interconnections including a contact (or a via) 114 penetrating through the first etch-stop layer ESL1 and the first interlayer dielectric layer ILD1, a wiring layer 214 penetrating through the second interlayer dielectric layer ILD2 formed over the first etch-stop layer ESL1, a contact (or a via) 314 penetrating through the second etch-stop layer ESL2 over the second interlayer dielectric layer ILD2, a contact (or a via) 318 formed in the third interlayer dielectric layer ILD3 over the second etch-stop layer ESL2, and a contact (or via) 414 formed on the same level as a combined structure including memory cells C1 and C2 and the contacts (or vias) 411 and 412. In some embodiments, a drain region D of the transistor 24 is electrically connected to a wiring 215 formed in the second interlayer dielectric layer ILD2 through a contact (or a via) 115 penetrating through the first etch-stop layer ESL1 and the first interlayer dielectric layer ILD1.

Still referring to FIG. 5, the transistor 24 in the peripheral region R2 and the transistors 25 and 26 in the memory region R1 are confined by shallow trench isolation (STI) in a substrate 101.

The substrate 10 can be a semiconductor substrate formed of, for example, one of Si, Ge, SiGe, SiC, SP, SiPC, InP, InAs, GaAs, AlInAs, InGaP, InGaAs, GaAsSb, GaPN, AlPN, and any other suitable material, or an insulating substrate such as a glass substrate.

The transistors 25 and 26 each include a gate dielectric layer GI formed over a channel region between the source region S and the drain region D, and a gate electrode layer G over the gate dielectric layer GI. Although not shown, the gate electrodes G of the transistors 25 and 26 can be connected to a control signal through contacts and wirings formed in the one or more interlayer dielectric layers.

On a level below the third etch-stop layer ESL3, i.e., on a level below a horizontal plane A-A' shown in FIG. 5, a vertical configuration in the memory region R1 and a vertical configuration in the peripheral region R2 are substantially the same, even though circuit layouts in the memory region R1 and the peripheral region R2 are different from each other. One of ordinary skill in the art should understand that manufacturing processes for forming the structures below the plane A-A' in the memory region R1 and the peripheral region R2 are substantially the same. These processes include, but not limited to, forming transistors 24, 25, and 26, and forming contacts (or vias) in the respective interlayer dielectric layers and etch-stop layers.

For convenience, only process steps of the manufacturing method for forming the structure of the memory device 100 from the horizontal plane A-A' to the wirings 415, 416, and 418 will be described below with references to FIGS. 6-19.

FIGS. 6-19 show process steps to manufacture the structure of the memory device 100 from the horizontal plane A-A' to the wirings 415, 416, and 418 shown in FIG. 5, by a method according to embodiments of the present disclosure. The structure of the memory device 100 below the wirings 315, 316, and 318 can be referred to FIG. 5 and thus are omitted in FIGS. 6-19 for convenience of illustration.

Figure 6:
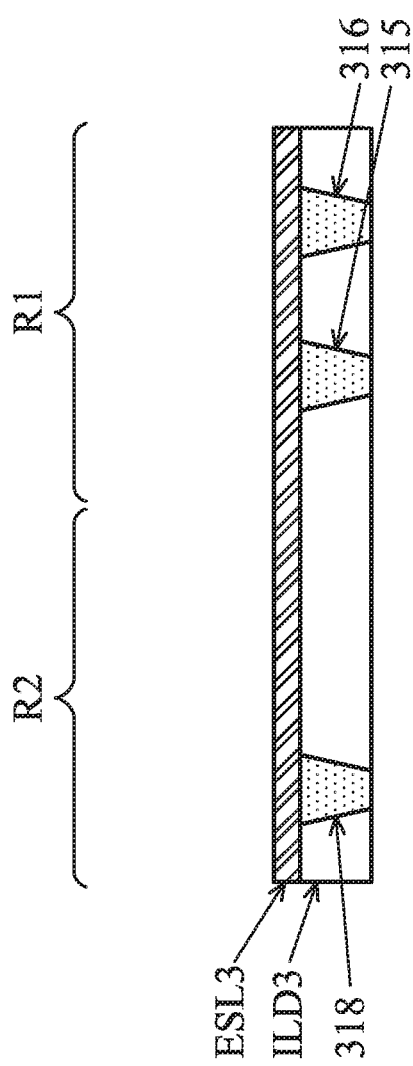
FIG. 6 shows a process step to manufacture a semiconductor device by a method according to embodiments of the present disclosure.

As shown in FIG. 6, the third etch-stop layer ESL3 is formed on the third interlayer dielectric layer ILD3 by, for example, CVD or LPCVD. The etch-stop layer ESL3 can be one of SiC, silicon nitride, silicon oxide, and have a thickness of about 10 nm to about 50 nm.

Figure 7:
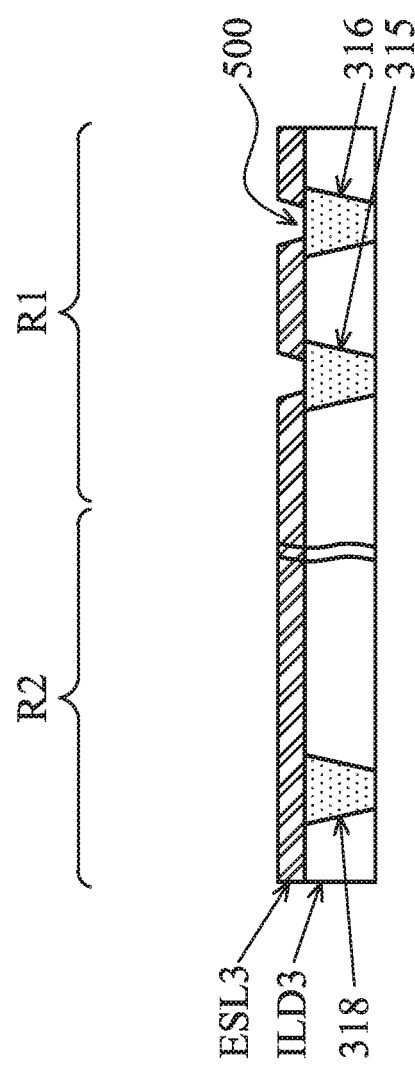
FIG. 7 shows a process step to manufacture a semiconductor device by a method according to embodiments of the present disclosure.

Next, as shown in FIG. 7, openings 500 are formed in the third etch-stop layer ESL3 by a photolithography process followed by an etching process to remove portions of the third etch-stop layer ESL3 exposed by a patterned photoresist layer, so as to expose the metal wirings 315 and 316 to allow the bottom electrodes of the memory cells (to be described later) to be electrically connected thereto. In this step, the metal wiring 318 in the peripheral region R2 is remained to be covered by the third etch-stop layer ESL3.

Figure 8:
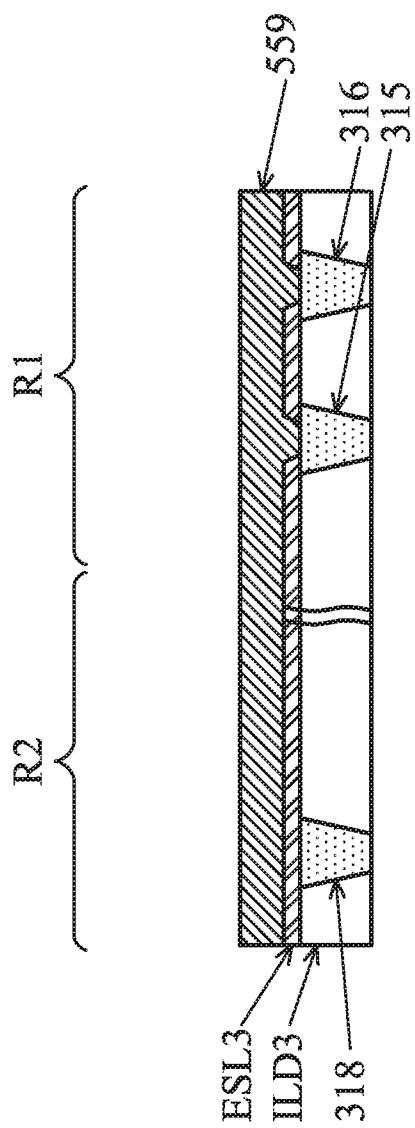
FIG. 8 shows a process step to manufacture a semiconductor device by a method according to embodiments of the present disclosure.

Thereafter, as shown in FIG. 8, a conductive layer 559 such as TiN and TaN, based on which the bottom electrodes of the memory cells are formed, is formed by CVD or PVD to fill the openings 500 and cover the upper surface of the etch-stop layer ESL3.

Figure 9:
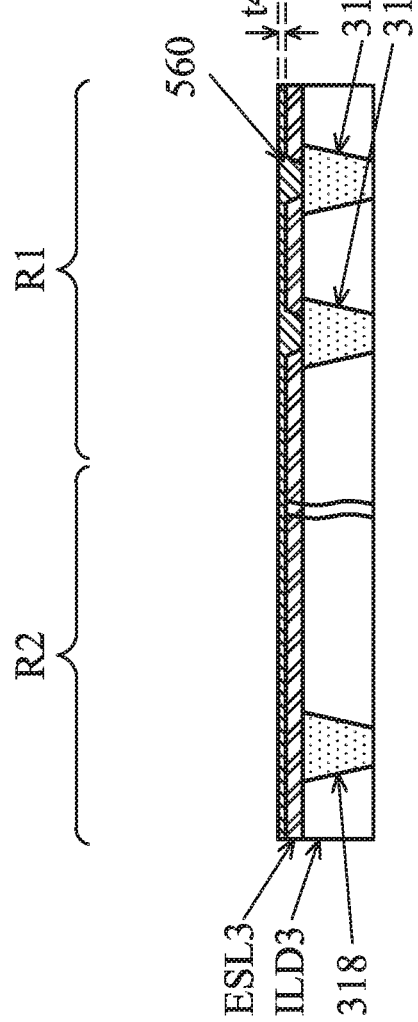
FIG. 9 shows a process step to manufacture a semiconductor device by a method according to embodiments of the present disclosure.

As shown in FIG. 9, a CMP is performed to the conductive layer 559 such that a thickness of the conductive layer 559 is reduced and the conductive layer 559 is thus converted to a metal layer 560 having a planarized upper surface. In some embodiments, a portion of the metal layer 560 above the third etch-stop layer ESL3 has a thickness t4 from about 10 nm to about 40 nm or from about 15 nm to about 20 nm.

Now referring to FIG. 10, another electrode layer 561, an emerging memory film 562, a top electrode layer 563 are sequentially formed over the metal layer 560. In a case in which the memory device 100 is an RRAM memory, the emerging memory film 562 is a transition-metal-oxide made of one or more of $HfO_2$, $Al_2O_3$, $ZrO_2$, $TaO_2$, or $Ta_2O_5$, and in case in which the memory device 100 is an MRAM device, the emerging memory film 562 is a magnetic tunnel junction (MTJ) film. The present disclosure, however, is noted limited thereto. Then, photoresist patterns PR are formed by a photolithography process to define regions corresponding to the memory cells.

As shown in FIG. 11, the photoresist patterns PR are transferred to form the top electrodes 513 and the memory films 512 of the memory cells by an etching process performed to the top electrode layer 563 and the emerging memory film 562, using the photoresist patterns PR as an etching mask. Accordingly, portions of the top electrode layer 563 and the emerging memory film 562 not covered by the photoresist patterns PR are removed, such that the another electrode layer 561 is exposed.

Figure 12:
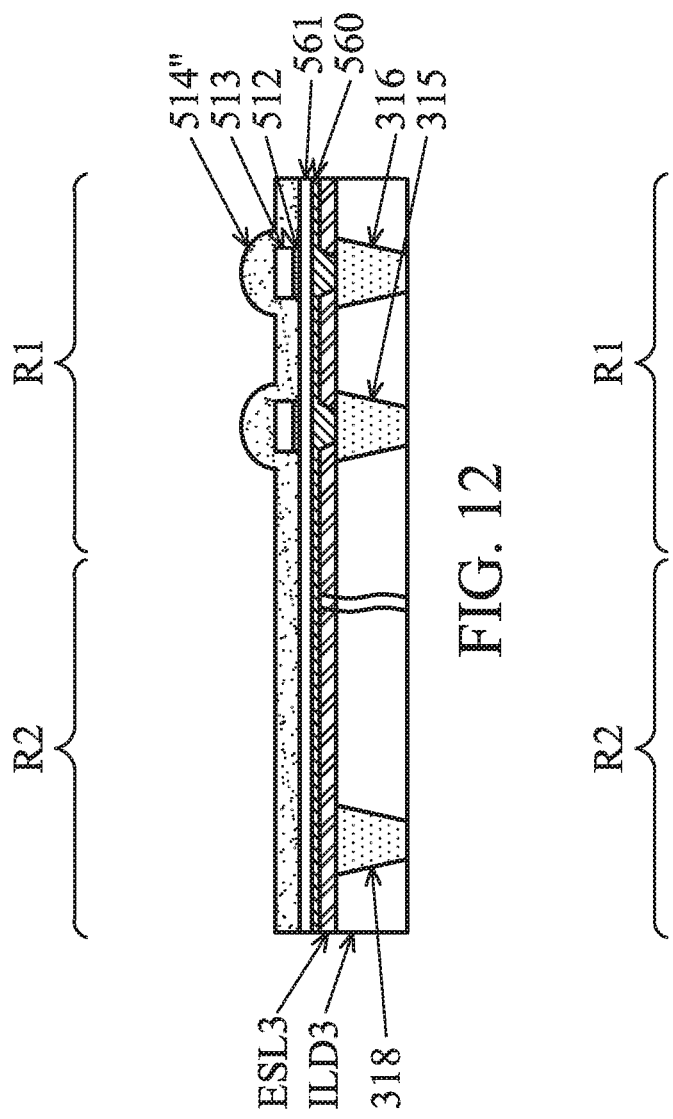
FIG. 12 shows a process step to manufacture a semiconductor device by a method according to embodiments of the present disclosure.

Thereafter, the photoresist patterns PR are removed. Then, a spacer layer 514" made of silicon nitride or SiC is formed to cover the formed structure by the process step shown in FIG. 11 and the exposed another electrode layer 561, as shown in FIG. 12.

Figure 13:
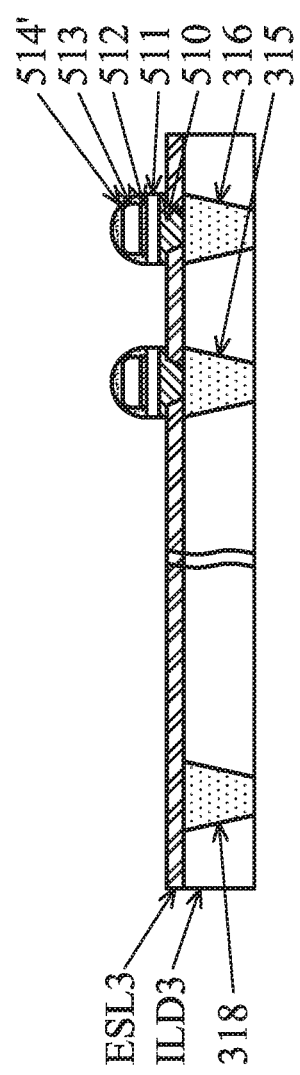
FIG. 13 shows a process step to manufacture a semiconductor device by a method according to embodiments of the present disclosure.

Next, as shown in FIG. 13, another etching process is performed to the spacer layers 514" so as to remove the portions of the spacer layers 514" covering the exposed another electrode layer 561. Subsequently, portions of the exposed another electrode layer 561 and the metal layer 560 not covered by the remaining portion of the spacer layers 514" are etched until an etching process stops at the etch-stop layer ESL3. In this case, the top electrodes 513 of the memory cells C1 and C2 remain to be covered by the remaining portion, denoted by reference numeral 514', of the spacer layer 514".

Figure 14:
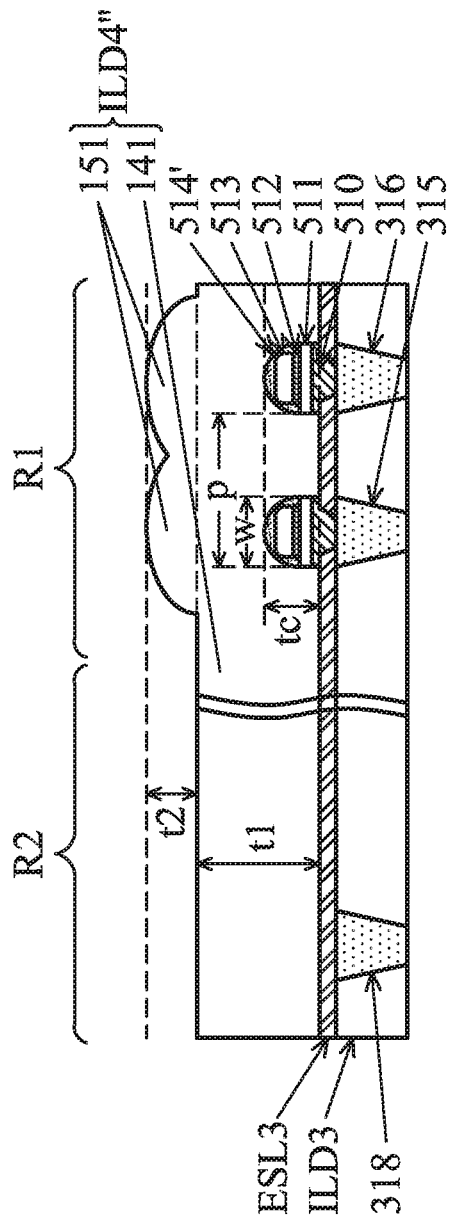
FIG. 14 shows a process step to manufacture a semiconductor device by a method according to embodiments of the present disclosure.

As shown in FIG. 14, an interlayer dielectric layer ILD4" is formed by PECVD, LPCVD, CVD, flowable CVD, or spin coating to cover the etch-stop layer ESL3 and the memory cells C1 and C2. Since at the time when the process shown in FIG. 13 finishes, the memory cells are formed only in the memory region R1 and no any other structures protrude from the third etch-stop layer ESL3 in the peripheral region R2, topography of the interlayer dielectric layer ILD4" in the peripheral region R2 is different from the memory region R1. In some embodiments, a portion 141 of the interlayer dielectric layer ILD4" formed in the peripheral region R2 has a flat upper surface and protrusions 151 of the interlayer dielectric layer ILD4" formed in the memory region R1 is higher than the portion 141 of the interlayer dielectric layer ILD4" formed in the peripheral region R2.

In some embodiments, a width w of each memory cell can be from about 50 nm to about 500 nm. In some embodiments, the width w of each memory cell can be from about 100 nm to about 200 nm. The present disclosure, however, is not limited thereto.

In some embodiments, a pitch p of the memory cells can be from about 100 nm to about 1000 nm. In some embodiments, the pitch p of the memory cells can be from about 180 nm to about 500 nm. The present disclosure, however, is not limited thereto.

In some embodiments, a height tc of each memory cell can be from about 30 nm to about 150 nm. In some embodiments, the height tc of each memory cell can be from about 50 nm to about 100 nm.

In some embodiments, a thickness t1 of the portion 141 of the interlayer dielectric layer ILD4", is greater than the thickness or height tc of the memory cells. The thickness t1 of the portion 141 of the interlayer dielectric layer ILD4" can be from about 90 nm to about 400 nm. In some embodiments, the thickness t1 of the protrusions 151 of the interlayer dielectric layer ILD4" can be from about 100 nm to about 300 nm. The present disclosure, however, is not limited thereto.

Although not shown, a portion of the interlayer dielectric layer ILD4" between adjacent protrusions 151 of the interlayer dielectric layer ILD4" can have a concave structure recessed toward the substrate 101, when the material to form the interlayer dielectric layer ILD4" fills the space between the memory cells at the time when the same material is simultaneously formed on the memory cells with a substantially the same deposition rate. In a case in which the portion of the interlayer dielectric layer ILD4" between adjacent protrusions 151 of the interlayer dielectric layer ILD4" has a concave structure, the thickness t1, defined to be the shortest distance from the lowest portion of the exterior surface of the concave structures to the substrate 10, is greater than the thickness tc of the memory cells. As such, regardless of the topography of the memory cells, the remaining interlayer dielectric layer ILD4" after the planarization process such as the chemical-mechanical polishing (CMP) to be described later can have a planarized surface over the memory cells.

In some embodiments, a thickness t2 of the protrusions 151 of the interlayer dielectric layer ILD4" is the same as or less than the height tc of each memory cell. In other embodiments, the thickness t2 of the protrusions 151 of the interlayer dielectric layer ILD4" is from about 30 nm to about 150 nm or from about 50 nm to about 100 nm. The present disclosure, however, is not limited thereto.

Figure 15:
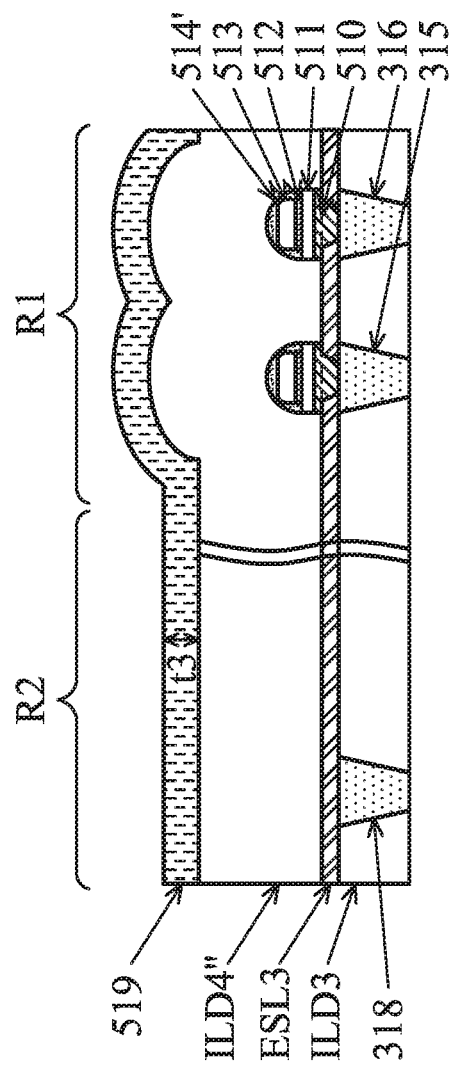
FIG. 15 shows a process step to manufacture a semiconductor device by a method according to embodiments of the present disclosure.

As shown in FIG. 15, a dummy layer 519 is formed to cover the interlayer dielectric layer ILD4".

In some embodiments, a thickness t3 of the dummy layer 519 can be from about 30 nm to about 100 nm.

In a case in which the thickness t3 of the dummy layer 519 is less than about 30 nm, the dummy layer 519 may not be able to completely cover the interlayer dielectric layer ILD4" which has non-flat topography caused by the memory cells, and thus, the in-situ sensing and endpoint detection tool may not be able to accurately detect the transition in planarizing from a mixture of the dummy layer 519 and the interlayer dielectric layer ILD4" to the entire dielectric layer 13, thereby lowering reliability of accurate control of the planarization process.

On the other hand, in a case in which the thickness t3 of the dummy layer 519 is more than about 100 nm, a processing time to form the dummy layer 519 is relatively long and thus, product turnaround time is relatively long, thereby increasing manufacturing cost.

The present disclosure, however, is not limited thereto. In other embodiments, the thickness t3 of the dummy layer 519 can be about 10 nm to about 300 nm, dependent on design particulars.

In some embodiments, the thickness t3 of the dummy layer 519 can be equal to greater than the thickness tc of the memory cells. In other embodiments, the thickness t3 of the dummy layer 519 can be less than the thickness tc of the memory cells. In one embodiment, t3=tc+t0 can be satisfied, in which t0 is a predetermined thickness, for example, from about 15 nm to about 25 nm, in accordance with a selected slurry used in the CMP.

In some embodiments, a material of the dummy layer 519 has a slower removal rate to the planarization process such as CMP as compared to a material of the interlayer dielectric layer ILD4". In some embodiments, a ratio of a rate to remove the interlayer dielectric layer ILD4" to a rate to remove the dummy layer 519 by slurry used in the CMP process, under the same process condition, is greater than 1 and equal to or less than 3. In some embodiments, the ratio of the rate to remove the interlayer dielectric layer ILD4" to the rate to remove the dummy layer 519 by the same CMP process can be 1.1 to 2.9 or can be 1.5 to 2.5; the present disclosure, however, is not limited thereto.

Next, a CMP process is performed to the dummy layer 519 until the dummy layer 519 is 519 completely removed. The in-situ sensing and endpoint detection tool integrated to the CMP tool can be used to detect and determine whether the dummy layer 519 is completely removed. In the transition of the CMP process performed to a mixture of the dummy layer 519 and the interlayer dielectric layer ILD4" to the material only including the material of the interlayer dielectric layer ILD4", the in-situ sensing and endpoint detection tool detects a change in reflected light such as spectrum or friction in accordance with a predetermined criterion. The in-situ sensing and endpoint detection tool determines that a change satisfying the predetermined criterion indicates that the dummy layer 519 is completely removed. Accordingly, the in-situ sensing and endpoint detection tool sends a control signal to the CMP tool to request to stop the CMP process.

Figure 16:
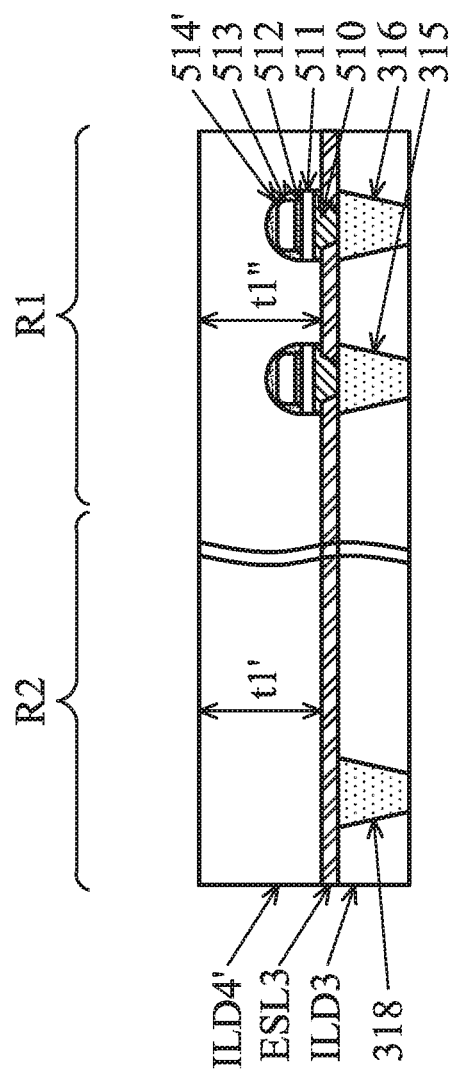
FIG. 16 shows a process step to manufacture a semiconductor device by a method according to embodiments of the present disclosure.

After removing the dummy layer 519 by the CMP tool, the interlayer dielectric layer ILD4" is planarized and becomes to a planarized interlayer dielectric layer ILD4' as shown in FIG. 16.

In other embodiments, the CMP process can continue for a predetermined period, for example, 10 seconds to 20 seconds, or continue for a predetermined number of CMP cycles, for example, 10 to 20 CMP cycles, once the in-situ sensing and endpoint detection tool senses such a change and sends such a control signal to the CMP tool to stop the CMP process. In this case, the extra CMP time/cycles can ensure complete removal of the dummy layer 519 but without directly impacting the memory cells embedded in the remaining portion of the interlayer dielectric layer ILD4". In some embodiments, the remaining interlayer dielectric layer ILD4" after the CMP process is reduced to a thickness t1' in the peripheral region R2 and becomes an interlayer dielectric layer ILD4' having a planarized upper surface suitable for additional processes. In some embodiments, 15 nm≤t1−t1'≤25 nm is satisfied, in a case in which the extra CMP process is performed to ensure the completely removal of the dummy layer 519. The present disclosure, however, is not limited to. In other embodiments, no extra CMP process is performed to at the time when the dummy layer 519 is just completely removed, and in this case, the thickness t1' of the interlayer dielectric layer ILD4' in the peripheral region R2 is the same as the thickness t1.

In some embodiments, the thickness t1' of the interlayer dielectric layer ILD4' in the peripheral region R2 and a thickness t" of the ILD4' in the memory region R1 can be the same or substantially the same. In other embodiments, due to a process variation/margin and/or due to a difference in materials on the level of the memory cells, a difference between the thickness t1' of the interlayer dielectric layer ILD4' in the peripheral region R2 and the thickness t" of the interlayer dielectric layer ILD4' in the memory region R1 can be 1 nm to 15 nm.

Since the portion 141 of the interlayer dielectric layer ILD4" has a thickness t1 greater than the thickness tc of the memory cell and the extra CMP process, if performed, will not remove the interlayer dielectric layer ILD4" to a level below the memory cells. As such, after the CMP process, the memory cells remain to be embedded in the interlayer dielectric layer ILD4' and are not impacted or damaged by the planarization process.

Additional description of the process steps shown from FIGS. 14-16 can be referred to that described with reference to FIGS. 2-4 and thus will be omitted to avoid redundancy. In some embodiments, the process(es) directed to the dielectric layer 13 and the materials for forming the dielectric layer 13, and the process(es) directed to the interlayer dielectric layer ILD4" and the materials for forming the interlayer dielectric layer ILD4" are interchangeable. In some embodiments, the process(es) directed to the dummy layer 16 and the materials for forming the dummy layer 16, and the process(es) directed to the dummy layer 519 and the materials for forming the dummy layer 519 are interchangeable. In some embodiments, the process(es) directed to the interlayer dielectric layer 17 and the materials for forming the interlayer dielectric layer 17, and the process(es) directed to the interlayer dielectric layer ILD4' and the materials for forming the interlayer dielectric layer ILD4' are interchangeable.

Figure 17:
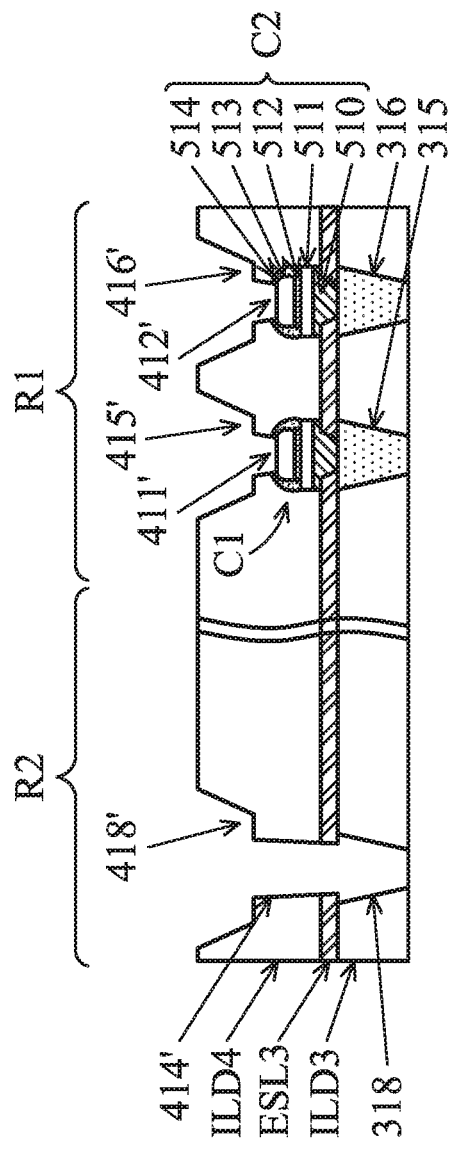
FIG. 17 shows a process step to manufacture a semiconductor device by a method according to embodiments of the present disclosure.
Figure 18:
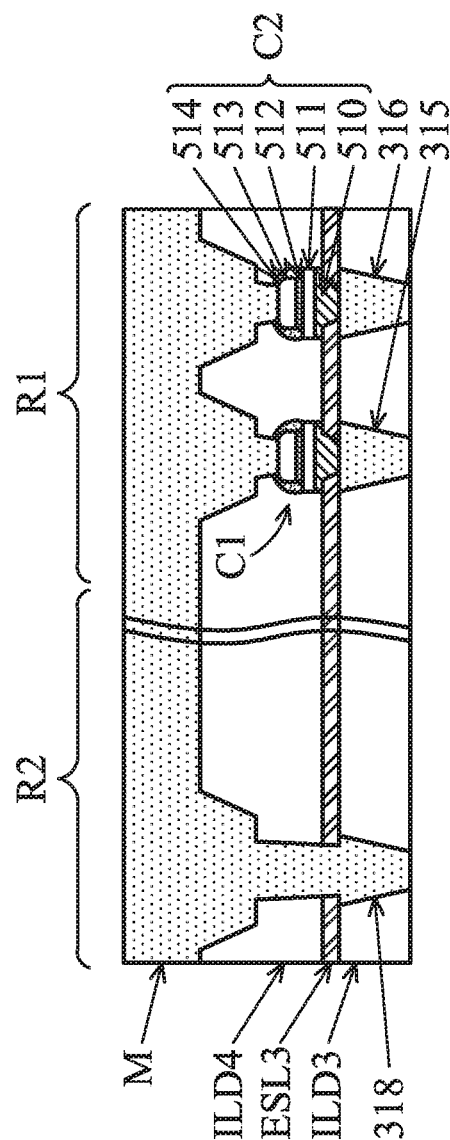
FIG. 18 shows a process step to manufacture a semiconductor device by a method according to embodiments of the present disclosure.
Figure 19:
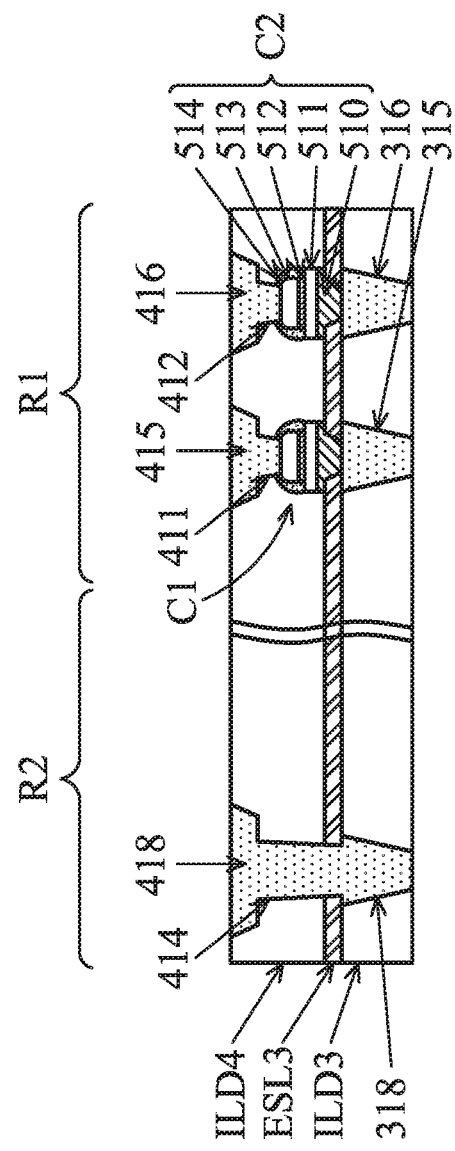
FIG. 19 shows a process step to manufacture a semiconductor device by a method according to embodiments of the present disclosure.

Next, as shown in FIG. 17, openings 414', 418', 411', 415', 412', and 416' are formed in in the interlayer dielectric layer ILD4' such that the third etch-stop layer ESL3 and the spacer layer 514 are exposed. An additional etching process can be formed to expose portions of the third etch-stop layer ESL3 and the spacer layer 514, such that the metal contact 318 disposed below the third etch-stop layer ESL3 and the top electrodes 513 of the memory cells C1 and C2 are exposed.

Thereafter, as shown in FIG. 14, a metal layer M made of Cu, W, Al, AlCu, TiN, TiW, Ti, Co, Ni, TaN, Ta, or any other suitable metals, or combination thereof is formed to fill in the openings 414', 418', 411', 415', 412', and 416' in the interlayer dielectric layer ILD4' and also to cover the upper surface of the interlayer dielectric layer ILD4'.

Referring to FIG. 15, a CMP process is performed to the metal layer M, such that the portion of the metal layer M on a level above the upper surface of the interlayer dielectric layer ILD4' is removed and thus the remaining portions of the metal layer M become the vias 411, 412, and 414, and the metal wirings 415, 416, and 418.

As such, the memory device 100 shown in FIG. 5 is formed.

In some embodiments, the memory cells C1 and C2 are inserted between inter-metal layers such as those denoted by reference numerals 411/415/412/416 and 311/315/312/316 in a back-end-of-line (BEOL) above the transistor layer.

In some embodiments, a CMP process is performed directly to a dummy layer and a dielectric layer to obtain a planarized upper surface of the dielectric layer, without using a compensation layer such as a patterned photoresist. In this case, a photolithography process is not performed after forming the dummy layer or after forming the dielectric layer and prior to performing the CMP process. As such, a manufacturing cost and manufacturing complexity can be reduced as compared to a comparative example, in which a photolithography process is used to in order to make compensation patterns before a CMP process in order to monitor the CMP process.

According to some aspects, topography of a dielectric layer covering structures such as memory cells can be improved by planarization such as chemical mechanical polishing/planarization (CMP). The structures and the dielectric layer can be formed, after CMOS process for forming transistors and/or some metal wirings, vias, and interlayer dielectric layers.

According to some aspects, after forming structures such as memory cells, a dielectric layer, such as extreme-low k (ELK) dielectric layer, is deposited to cover the structures and the remaining portion of a substrate.

According to some aspects, a dummy layer is formed to cover a dielectric layer prior to CMP. The CMP using the dummy layer as a CMP control layer provides a larger and less expensive process window in BEOL, as compared to a CMP process directly performed to a dielectric layer.

According to some aspects, a photolithography process is not used after forming a dielectric layer but prior to performing a CMP process to the dielectric layer, in order to obtain a planarized dielectric layer over structures.

According to some aspects, the above method can be used not only to planarize a dielectric layer in BEOL, but also to planarize a dielectric layer in front-end-of-line (FEOL).

According to some aspects, the above method can be used to planarize a dielectric layer by using a dummy layer. One of ordinary skill in the art should understand that the above method can be modified to planarize a layer other than a dielectric layer with another suitable dummy layer.

In one embodiment, a method for manufacturing a semiconductor device includes forming a structure protruding from a substrate, forming a dielectric layer covering the structure, forming a dummy layer covering the dielectric layer, and performing a planarization process to completely remove the dummy layer. In one embodiment, the planarization process is directly performed to the dummy layer after forming the dummy layer. A material of the dummy layer has a slower removal rate to the planarization process than a material of the dielectric layer. In one embodiment, the method further includes detecting a change in the planarization process indicating that the dummy layer is completely removed, and the planarization process continues for a predetermined period or for a predetermined number of planarization cycles, in response to a detection of the change in the planarization process indicating that the dummy layer is completely removed. In one embodiment, a thickness of the dielectric layer prior to the planarization process is greater than a thickness of the structure. In one embodiment, after forming the dummy layer and before performing the planarization process, no photoresist is formed. In one embodiment, an array of the structures are formed in a first region of the substrate, and the substrate includes a second region adjacent to the first region, and before performing the planarization process, a distance, along a thickness direction of the substrate, from an exterior surface of a first portion of the dielectric layer on the first region to a surface of the substrate, is greater than a distance, along the thickness direction of the substrate, from an exterior surface of a second portion of the dielectric layer on the second region to the surface of the substrate. In one embodiment, the dielectric layer is an extreme-low k (ELK) dielectric layer. In one embodiment, the ELK includes one or more of fluorine-doped silicon dioxide (FSG), carbon-doped silicon dioxide (SOC), porous silicon dioxide, or porous (SiOC). In one embodiment, the dummy layer is made of one selected from the group consisting of TiN, TaN, USG oxide, SiON, TEOS, and a combination thereof. In one embodiment, a ratio of a removing rate of the dielectric layer to a removing rate of the dummy layer performed by the planarization process is greater than 1 and equal to or less than 3. In one embodiment, the structure is a memory cell. In one embodiment, the memory cell includes a bottom electrode, a memory film, and a top electrode stacking on each other in a thickness direction of the substrate, and the memory film is made of transition-metal-oxide including one or more of $HfO_2$, $Al_2O_3$, $ZrO_2$, $TaO_2$, or $Ta_2O_5$. In one embodiment, the memory cell includes a bottom electrode, a memory film, and a top electrode stacking on each other in a thickness direction of the substrate, and the memory film is made of a magnetic tunnel junction (MTJ) film. In one embodiment, the method further includes prior to forming the structure, forming a plurality of transistors and vias and metal wirings over the plurality of transistors to electrically connect to source and/or drain regions of the plurality of transistors. The structure is electrically connected to one or more of the plurality of transistors through the vias and the metal wirings. In one embodiment, the method further includes after the planarization process, forming an opening in the dielectric layer, and forming a contact in the opening in the dielectric layer to electrically connect to the structure.

In one embodiment, a method for manufacturing a memory device includes forming first transistors on a first region of a substrate and second transistors on a second region of the substrate, forming an array of memory cells in the first region and electrically connected to the first transistors, forming a dielectric layer covering the memory cells and extending to the second region of the substrate, forming a dummy layer covering the entire upper surface of the dielectric layer, and performing a planarization process directly to the dummy layer. A material of the dummy layer has a slower removal rate to the planarization process than a material of the dielectric layer. In one embodiment, each memory cell includes a bottom electrode, a memory film, and a top electrode stacking on each other in a thickness direction of the substrate, and the memory film is made of transition-metal-oxide including one or more of $HfO_2$, $Al_2O_3$, $ZrO_2$, $TaO_2$, or $Ta_2O_5$, or the memory film is made of a magnetic tunnel junction (MTJ) film. In one embodiment, the method further includes after the planarization process, forming openings in the dielectric layer; and forming contacts in the openings in the dielectric layer to electrically connect to the memory cells and to the second transistors.

In one embodiment, a method for manufacturing a memory device includes forming first transistors on a first region of a substrate and second transistors on a second region of the substrate, forming interlayer dielectric layers and contacts in the interlayer dielectric layers to electrically connected to the first transistors and the second transistors, forming an array of memory cells in the first region and electrically connected to the first transistors, forming a dielectric layer covering the memory cells and extending to the second region of the substrate, forming a dummy layer made of one selected from the group consisting of TiN, TaN, USG oxide, SiON, TEOS, and a combination thereof to cover the entire upper surface of the dielectric layer, and performing a planarization process directly to the dummy layer until the dummy layer is completely removed. In one embodiment, the method further includes after the planarization process, forming openings in the dielectric layer, and forming contacts in the openings in the dielectric layer to electrically connect to the memory cells and to the second transistors.

The term "embodiment" or "embodiments" described above does not refer to the same embodiment or the same embodiments, and is provided to emphasize a particular feature or characteristic different from that of other embodiment or embodiments. One of ordinary skill in the art should understand that "embodiment" or "embodiments" described above can be considered to be able to be implemented by being combined in whole or in part with one another, unless an opposite or contradictory description is provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
    forming a dielectric layer over a memory cell disposed on a substrate;
    forming a dummy layer comprising TiN or TaN over the dielectric layer; and
    chemical mechanical polishing (CMP) the dummy layer, wherein the dummy layer has a slower removal rate during the CMP than the dielectric layer, and
    the memory cell includes a memory film made of a magnetic tunnel junction (MTJ) film.

2. The method according to claim 1, wherein the chemical mechanical polishing process removes the dummy layer.

3. The method according to claim 1, further comprising detecting a change in the chemical mechanical polishing indicating that the dummy layer is completely removed.

4. The method according to claim 3, wherein the chemical mechanical polishing continues for a period or for a number of polishing cycles, in response to a detection of the change in the chemical mechanical polishing indicating that the dummy layer is completely removed.

5. The method according to claim 1, wherein a thickness of the dielectric layer prior to the chemical mechanical polishing is greater than a height of the memory cells.

6. The method according to claim 1, wherein:
    an array of the memory cells is formed in a first region of the substrate before forming the dielectric layer.

7. The method according to claim 1, wherein the dielectric layer is an extreme-low k (ELK) dielectric layer.

8. The method according to claim 7, wherein the ELK includes one or more of fluorine-doped silicon dioxide (FSG), carbon-doped silicon dioxide (SOC), porous silicon dioxide, or porous SiOC.

9. The method according to claim 1, wherein a ratio of a removing rate of the dielectric layer to a removing rate of the dummy layer by the chemical mechanical polishing is greater than 1 and equal to or less than 3.

10. The method according to claim 1, wherein the memory cell includes a bottom electrode, a memory film, and a top electrode stacked on each other in a thickness direction of the substrate.

11. The method according to claim 1, wherein the memory film is made of one or more of $HfO_2$, $Al_2O_3$, $ZrO_2$, $TaO_2$, or $Ta_2O_5$.

12. The method of claim 1, further comprising prior to forming the memory cell, forming a transistor, and a via, and a metal wiring over the transistor to electrically connect the transistor to the memory cell.

13. The method of claim 1, further comprising:
    after the chemical mechanical polishing, forming an opening in the dielectric layer; and
    forming a contact in the opening in the dielectric layer to electrically connect to the memory cell.

14. A method for manufacturing a memory device, the method comprising:
    forming a first transistor on a first region of a substrate and a second transistor on a second region of the substrate;
    forming a memory cell electrically connected to the first transistor in the first region;
    forming a dielectric layer over the memory cell;
    forming a dummy layer over an upper surface of the dielectric layer; and
    chemical mechanical polishing (CMP) the dummy layer, wherein the dummy layer has a slower removal rate during the CMP than the dielectric layer.

15. The method according to claim 14, wherein a ratio of a removing rate of the dielectric layer to a removing rate of the dummy layer by the chemical mechanical polishing is greater than 1 and equal to or less than 3.

16. The method according to claim 14, wherein the memory cell includes a bottom electrode, a memory film, and a top electrode stacked on each other in a thickness direction of the substrate.

17. A method for manufacturing a memory device, the method comprising:
- forming a plurality of first transistors on a first region of a substrate and a second transistor on a second region of the substrate;
- forming interlayer dielectric layers and contacts in the interlayer dielectric layers to electrically connect to the first transistors and the second transistor;
- forming a plurality of memory cells in the first region, each memory cell electrically connected to a first transistor,
- wherein each memory cell comprises a memory film disposed between a bottom electrode and a top electrode;
- forming a dielectric layer over the memory cells;
- forming a dummy layer over an upper surface of the dielectric layer; and
- chemical mechanical polishing the dummy layer until the dummy layer is completely removed.

18. The method according to claim 17, wherein a ratio of a removing rate of the dielectric layer to a removing rate of the dummy layer by the chemical mechanical polishing is greater than 1 and equal to or less than 3.

19. The method according to claim 17, further comprising detecting a change in the chemical mechanical polishing indicating that the dummy layer is completely removed.

20. The method according to claim 19, wherein the chemical mechanical polishing continues for a period or for a number of polishing cycles, in response to a detection of the change in the chemical mechanical polishing indicating that the dummy layer is completely removed.

* * * * *